(12) United States Patent
Anturna

(10) Patent No.: US 6,931,364 B1
(45) Date of Patent: Aug. 16, 2005

(54) VOLUME DETAILED BUILDING STRUCTURE

(76) Inventor: G. Douglas Anturna, 16994 Quincy St., Holland, MI (US) 49424

( * ) Notice: Subject to any disclaimer, the term of this patent is extended or adjusted under 35 U.S.C. 154(b) by 0 days.

(21) Appl. No.: 09/483,542

(22) Filed: Jan. 14, 2000

(51) Int. Cl.⁷ .............................................. G06F 17/50
(52) U.S. Cl. ................... 703/1; 703/6; 703/7; 345/420; 345/629; 52/143; 52/690
(58) Field of Search .................... 703/1, 6, 7; 700/182; 345/420; 52/143

(56) References Cited

U.S. PATENT DOCUMENTS

| | | | |
|---|---|---|---|
| 4,483,117 A * | 11/1984 | Underhill et al. .............. | 52/639 |
| 4,551,810 A * | 11/1985 | Levine ........................ | 700/182 |
| 4,964,060 A * | 10/1990 | Hartsog ......................... | 703/1 |
| 5,227,983 A * | 7/1993 | Cox et al. ...................... | 703/1 |
| 5,307,295 A * | 4/1994 | Taylor et al. ................... | 703/1 |
| 5,430,662 A * | 7/1995 | Ahonen ......................... | 703/1 |
| 5,557,537 A * | 9/1996 | Normann et al. .............. | 703/1 |
| 5,640,812 A * | 6/1997 | Crowley et al. ............. | 52/90.1 |
| 5,657,606 A * | 8/1997 | Ressel et al. ................. | 52/690 |
| 5,740,341 A * | 4/1998 | Oota et al. ................... | 345/420 |
| 5,983,010 A * | 11/1999 | Murdock et al. .............. | 703/6 |
| 5,986,670 A * | 11/1999 | Dries et al. ................. | 345/629 |
| 6,000,192 A * | 12/1999 | Cohen et al. .............. | 52/745.2 |
| 6,253,504 B1 * | 7/2001 | Cohen et al. ................. | 52/143 |
| 6,438,922 B1 * | 8/2002 | DeLeFevre ................ | 52/741.1 |

OTHER PUBLICATIONS

"Building Simulation: State of the art and the role of IBPSA" J. Hensen, University of Strathclyde, IBPSA Sep. 1999.*

"OSCONCAD: A Model-Based CAD System with Integrated Computer Applications", F. Marir, Itcon, vol. 3, Jul. 1998.*

"Reconstruction of 3D Virtual Buildings for 2D Architectural Floor Plans", C. So, ACM 1-58113-019-8/98/0011, ACM Nov. 1998.*

"AutoCAD and its Applications Advanced", T. Shumaker, The Goodheart-Wilcox Company, ISBN 1-56637-414-6, 1998.*

"AutoCAD Users Guide", Autodesk Inc, Release 14, Dec. 1997.*

* cited by examiner

*Primary Examiner*—Jean R. Homere
*Assistant Examiner*—Fred Ferris
(74) *Attorney, Agent, or Firm*—Price, Heneveld, Cooper, DeWitt & Litton, LLP

(57) ABSTRACT

The present invention is directed to a technique of volume detailing a building structure that allow for the consideration of the positioning of various structural and non-structural components. Initially, a three dimensional building structure volume is created. Next, a three dimensional component is positioned at a desired location in the three dimensional building structure volume. Finally, the three dimensional building structure volume is sectioned at a point of interest to provide a building structure profile that includes a component profiled if the three dimensional component extends through the point of interest. In another embodiment, a plurality of additional component profiles are placed within the building structure profile at the point of interest such that the additional component profiles do not interfere with one another or interfere with the component profile of the three dimensional component.

8 Claims, 7 Drawing Sheets

VOLUME DETAILED BUILDING STRUCTURE

BACKGROUND OF THE INVENTION

The present invention is directed to detailing a building structure, and more specifically to volume detailing a building structure.

Traditionally, designers utilizing computer aided design (CAD) systems have designed building structures as a series of planes. That is, the structural members of a particular building structure (e.g., roof trusses) have been designed in a series of planes. Utilizing this approach, a designer has created each member (i.e., each top chord, bottom chord and web member) of an individual truss in a single plane. Unfortunately, trusses designed in this manner have not allowed for the consideration of the positioning of various structural and non-structural components in the building structure. Additionally, when building structures are designed as a series of planes, CAD packages are incapable of providing reference information between arbitrary locations in multiple planes.

As a result, when ductwork and walkways have been installed in a building structure (utilizing trusses so designed), an installer has been required to crawl through the structure to determine the routing of such non-structural components. For example, an installer of heating, ventilation and air-conditioning (HVAC) systems has been required to crawl through the attic space measuring the openings between web members of a truss to determine the exact routing of the HVAC ductwork. In some cases, it has been necessary to modify a truss on-site to accommodate structural or non-structural components of a building structure. Before modifying the truss, a designer has been required to determine whether the truss, as modified to accommodate the structural or non-structural component, will meet a designed load. In many cases, the manufacturing of a new truss has been required to meet the designed load. This has resulted in delay of the construction of the building structure, as well as, increased cost.

While many CAD systems have been utilized to model the parts of various mechanical apparatus (e.g., a shaft and a gear that mounts to the shaft) as solids, so that a designer could check the interference between those parts, this concept has not been extended to building structures. As such, a method of detailing a building structure that allows for the consideration of the positioning of various structural and non-structural components during design of the building structure, is desirable.

SUMMARY OF THE INVENTION

The present invention is directed to a technique of volume detailing a building structure that allow for the consideration of the positioning of various structural and non-structural components. Initially, a three dimensional building structure volume is provided that models the building structure. Next, a three dimensional component is positioned at a desired location in the three dimensional building structure volume. Then, the three dimensional building structure volume is sectioned at a point of interest to provide a building structure profile that includes a component profile, if the three dimensional component extends through the point of interest.

In another embodiment, a plurality of additional component profiles are placed within the building structure profile at the point of interest such that the additional component profiles do not interfere with one another or interfere with the component profile of the three dimensional component. These additional component profiles may correspond to structural components or non-structural components. In this manner, the building structure can be detailed such that, the positioning of various structural and non-structural components is considered when the building structure is designed. Another advantage of this approach is that reference information can be obtained between arbitrary locations in the building structure volume.

These and other features, advantages and objects of the present invention will be further understood and appreciated by those skilled in the art by reference to the following specification, claims and appended drawings.

DETAILED DESCRIPTION OF THE PREFERRED EMBODIMENTS

Figure 1A:
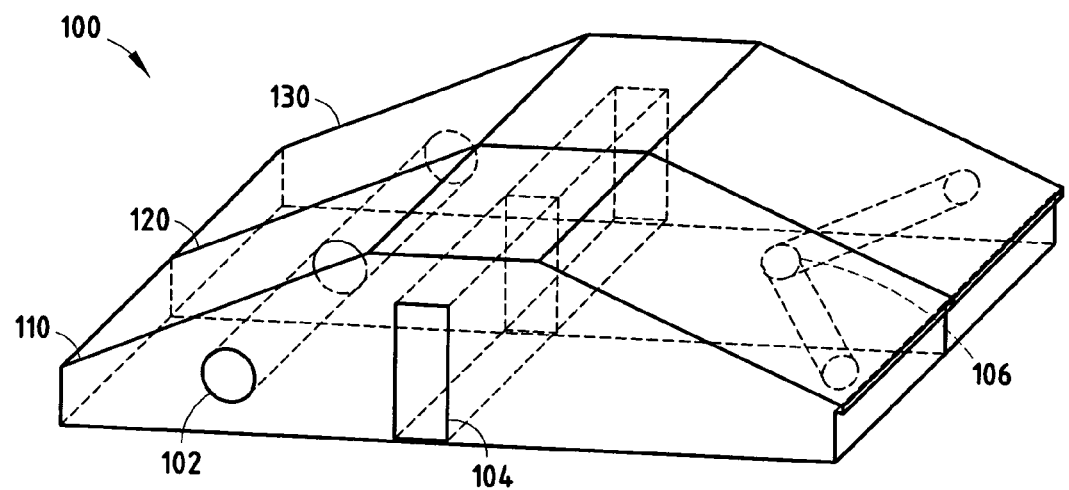
FIG. 1A is a view of a roof truss volume.

A building structure is volume detailed by adding to and/or subtracting from a volume extruded from a predetermined building structure profile. A typical building structure includes a roof/attic space formed by a system of roof trusses, walls and floors. The building structure can be detailed in parts or as a whole. Additionally, the concept can be extended to detailing structural steel, mechanical (ductwork and walkways), fire protection systems, concrete, metal decking, elevators and various other structures and materials. Volume detailing can be implemented with practically any commercially available three dimensional (3D) graphics system. Slicing the building structure, at a desired location, provides an outline of each structural and non-structural component that can then be considered in the design and layout of the building structure.

A typical computer-aided design (CAD) system, is capable of indicating interferences between components in a building structure volume. As is well known to one of ordinary skill in the art, an interference occurs when two volumes attempt to occupy the same space. In AutoCAD® 2000, interferences are indicated by differing colors. One of ordinary skill in the art will appreciate that interferences can be indicated through other means (e.g., a pattern). When an interference occurs, the interfering volume can be removed or the volume of the building structure can be adjusted to accept the additional volume, if desired.

An example of where the present technique is advantageous is in the design and layout 20 of the roof/attic space. A roof/attic space volume (i.e., solid) is shaped by creating various eave/slope outlines as a 2-dimensional object which is then extended (extruded in AutoCAD® 2000) to the desired limits. Various component profiles (e.g., ductwork and walkways) are extruded from a start point to an end point in a three dimensional field. In a preferred embodiment, after the component interferences (e.g., beams, HVAC, walkways, etc.) have been created and positioned the component interferences are subtracted from the building structure volume. At that point, the volume is sectioned at a desired location and a profile is provided that enables a designer to design, for example, a truss that accommodates all structural and non-structural components. After the various members (e.g., web, top chord and bottom chord) of a truss are placed and dimensioned, a third party load analysis program can be initiated to determine whether the truss, as currently configured, will meet design criteria (e.g., support the required loads) when installed in a building.

In a preferred embodiment, the present invention utilizes a plurality of LISP modules that customize an AutoCAD® 2000 package. The LISP modules are within the ability of one of ordinary skill in the art and as such are not further discussed herein. One of ordinary skill in the art will readily appreciate that the present invention can be implemented with virtually any number of 3D CAD programs. In the preferred embodiment, a customized icon bar is added to the AutoCAD tool bar menu. At a start project icon various information is accepted from a user (e.g., an order number, a project name, a project location, a customer name, an architect name, a top chord live load, a top chord dead load, a bottom chord live load, a bottom chord dead load, wind load/speed and truss bearing elevation).

FIG. 1A is a view of a roof truss volume 100. Roof truss volume 100 models a system of roof trusses 110, 120 and 130. As shown in FIG. 1A, a plurality of three dimensional non-structural components (i.e., an airduct 102, a walkway 104 and an airduct 106) are positioned in a desired location within the roof truss volume 100. As will be further described below with reference to FIGS. 1B, 1C and 1D, the roof truss volume is sectioned, at a point of interest, to provide a plurality of roof truss profiles 110, 120 and 130 that includes a component profile, if a three dimensional component (e.g., airduct 102, walkway 104 and airduct 106) extends through the point of interest. The roof truss profiles provide a designer with information (i.e., components profiles) that can be considered when, for example, structural components (e.g., web members) are positioned in a roof truss.

Figure 1B:
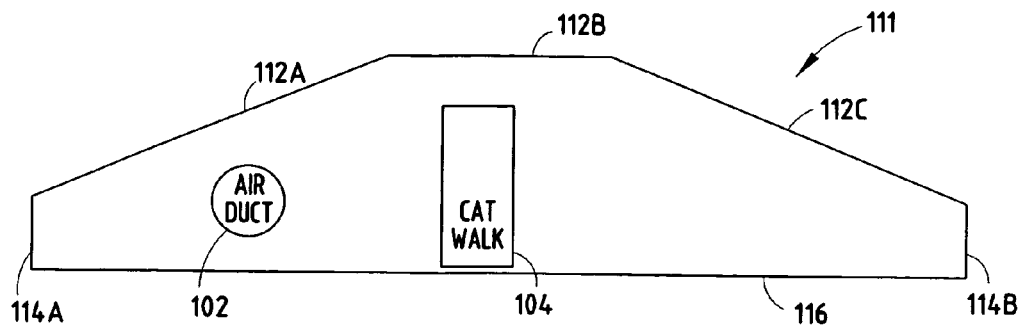
FIGS. 1B–1D are front views of a roof truss profile sectioned from the roof truss volume of FIG. 1A at various roof truss locations.

FIG. 1B is a front view of a roof truss profile 111 sectioned from roof truss volume 100. The roof truss profile 111 of roof truss 110, is obtained by sectioning the roof truss volume 100 at the location of roof truss 110. An outer border of the roof truss profile 111 is essentially formed by top chords 112A, 112B and 112C, heels 114A and 114B and a bottom chord 116 of roof truss 110. The component profile of airduct 102 and walkway 104 enables a designer to consider the placement of these components when placing a plurality of structural components (i.e., web members in truss 110 such that the web members do not interfere with the component profiles of airduct 102 and walkway 104). When a CAD package such as AutoCAD® is utilized, the component profiles are provided by subtracting each three dimensional component from the roof truss volume 100 and invoking the interference command.

Figure 1C:
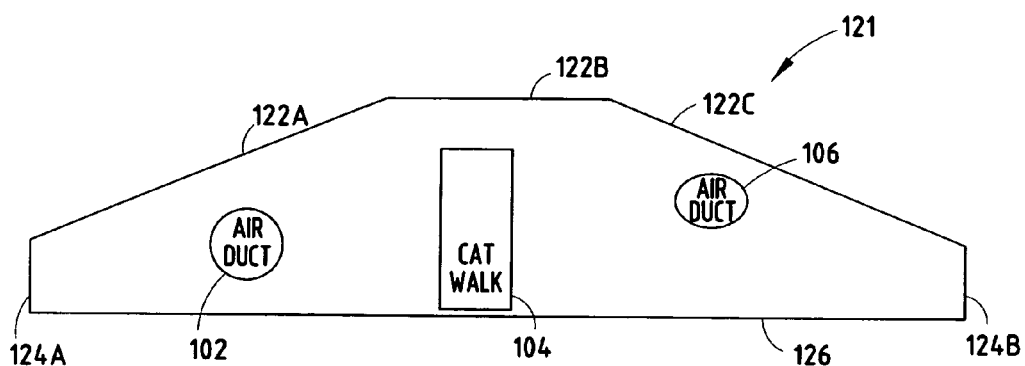

FIG. 1C is a front view of a roof truss profile 121. The roof truss profile 121, of roof truss 120, is obtained by sectioning the roof truss volume 100 at roof truss 120. An outer border of the roof truss profile 121 is essentially formed by top chords 122A, 122B and 122C, heels 124A and 124B and a bottom chord 126. Component profiles of three dimensional components that extend through the point of interest are also shown. That is, the component profile for airduct 102, walkway 104 and airduct 106 are included within roof truss profile 121 of roof truss volume 100. Similar to FIG. 1B, the profile of FIG. 1C allows a designer to place web members within the profile of truss 120 without interfering with airduct 102, walkway 104 or airduct 106.

Figure 1D:
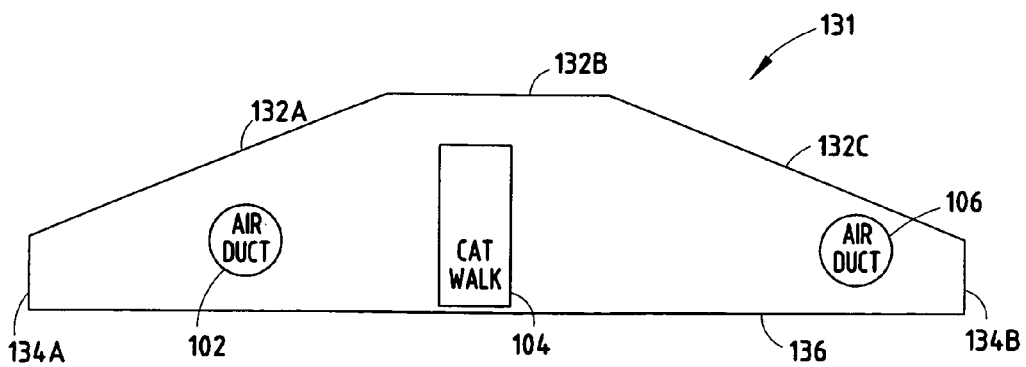

FIG. 1D is a front view of a roof truss profile 131. The roof truss profile 131, of roof truss 130, is obtained by sectioning the roof truss volume 100 at the location of roof truss 130. An outer border of the roof truss profile 131 is essentially formed by top chords 132A, 132B and 132C, heels 134A and 134B and a bottom chord 136. FIG. 1D also depicts a component profile for airduct 102, walkway 104 and airduct 106 where the components would extend through the roof truss volume 100 at roof truss 130. As with FIGS. 1B–1C, a designer can then place web members within the truss profile 131 of truss 130 such that they do not interfere with airduct 102, walkway 104 or airduct 106. This technique advantageously allows a designer to consider the positioning of various structural and non-structural components when detailing the roof truss volume. This is desirable because it allows a designer to position various structural and non-structural components, within the roof truss volume, when designing that portion of the building structure. This reduces the on-site modifications to a truss and allows component placement to be considered in advance of truss and building assembly.

Figure 2A:
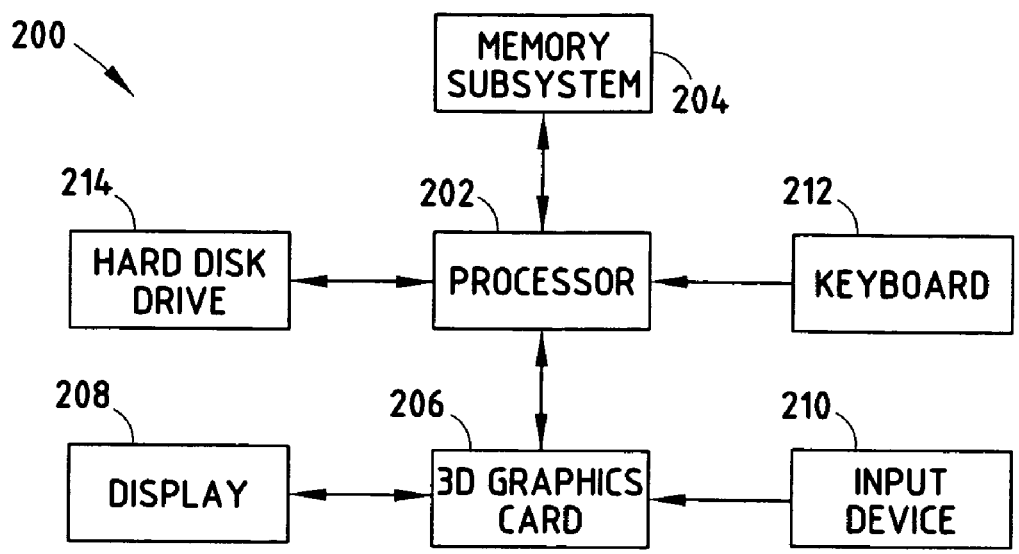
FIG. 2A is a block diagram of a typical computer system that can be utilized for executing a 3D CAD package for volume detailing a building structure.

FIG. 2A is a block diagram of a typical computer system that can be utilized for executing a 3D CAD package for volume detailing a building structure. System 200 includes a processor 202 that is coupled to a keyboard 212, a memory sub-system 204, a fixed or removable hard disk drive 214 (e.g., a CD-ROM) and a 3D graphics card 206. Memory subsystem 204 includes an application appropriate amount of volatile and non-volatile memory. Hard disk drive 214 is used for storing an operating system and various applications and data. 3D graphics card 206 is coupled to an input device 210 (e.g., a mouse) and a display 208. 3D graphics card 206 receives input from a user through input device 210 and provides output to a user through display 208. In the preferred embodiment, the 3D graphics card 206 is coupled to an accelerated graphics port (AGP) of processor 202. However, one of skill in the art will appreciate that 3D graphics card 206 can be coupled to processor 202 through other legacy interfaces.

Figure 2B:
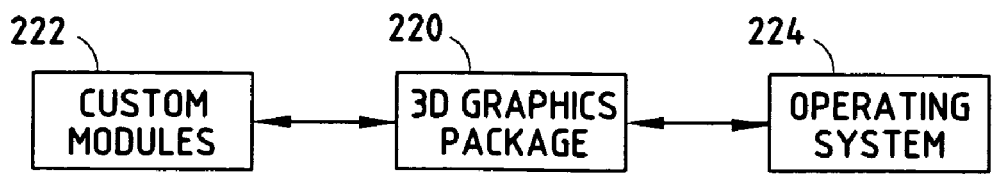
FIG. 2B is a block diagram depicting the interaction of a 3D graphics package with an operating system and custom modules.

FIG. 2B is a block diagram depicting the interaction of a 3D graphics package 220 with an operating system 224 and custom modules 222. As discussed above, custom modules provide the ability for a user to customize various features of the CAD package. As stated above, the 3D graphics package 220 is preferably AutoCAD® 2000. As is also discussed above, custom modules 222 are preferably written in LISP and allow the designer to customize various features of AutoCAD® 2000 to further enhance the ability of AutoCAD® 2000 to perform volume detailing of a building structure. The creation of appropriate custom modules 222 is considered to be within the ability of one of ordinary skill in the art (upon reading the disclosure herein) and as such is not further discussed herein. Operating system 224 interfaces with 3D graphics package 220 and preferably provides a graphical user interface (GUI) for the 3D graphics package 220.

Figure 3A:
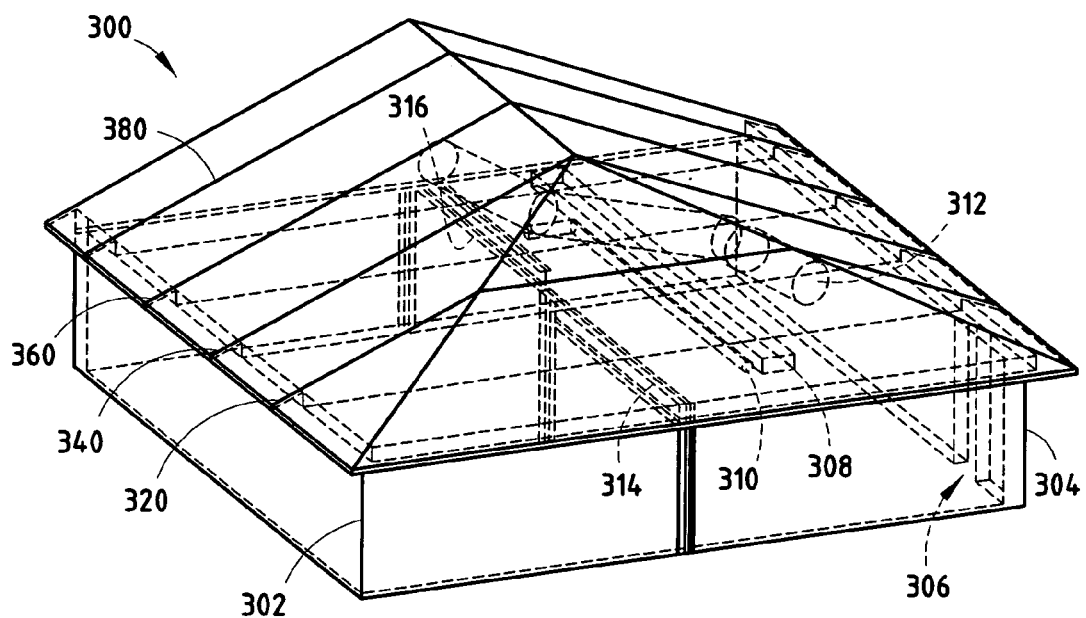
FIG. 3A is a view of a building structure volume.

FIG. 3A is a view of a building structure volume 300 that provides for the further elaboration of volume detailing a building structure, according to an embodiment of the present invention. Building structure volume 300 includes four roof trusses 320, 340, 360 and 380. The roof trusses 320, 340, 360 and 380 are vertically supported near one end by a wall 302 and near an opposite end by a wall 304. Wall 304 includes an opening 306 (e.g., for a door). Roof trusses 320 and 324 are supported near a mid-point by an I-beam 314. Roof trusses 360 and 380 are attached to an I-beam 316. An airduct 308, an airduct 310 and an airduct 312 are routed through the building structure volume 300 at a desired location.

Figure 3B:
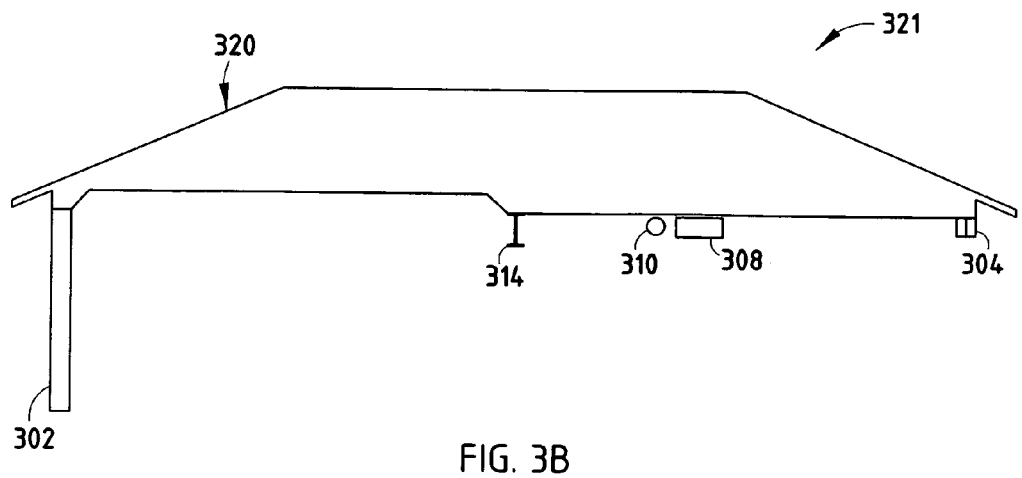
FIGS. 3B–3E are front views of a building structure profile sectioned from the building structure volume of FIG. 3A at various roof truss locations.

FIG. 3B shows a building structure profile 321. The building structure profile 321, of building structure volume 300, is obtained by sectioning the building structure volume at the location of roof truss 320. As shown in FIG. 3B, roof truss 320 is supported by wall 302, wall 304 and I-beam 314. The building structure profile 321 also includes a component profile of airduct 310 and airduct 308 which are routed below roof truss 320. By examining the building structure profile 321, a designer adding web members to roof truss 320 would know that additional web members could be placed within the profile of roof truss 320 without concern for interference with other components. Additionally, a designer can determine where other components can be routed through the building structure volume 300, at locations below roof truss 320. A designer can also derive other information from building structure profile 321. For example, from profile 321 a designer would know that wall 304 includes an opening at the location of roof truss 320.

Figure 3C:
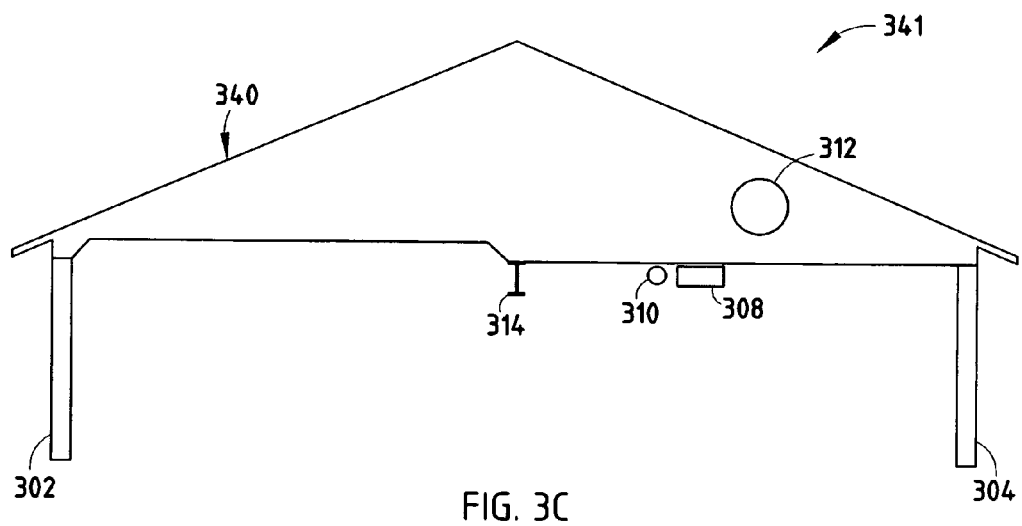

FIG. 3C shows a building structure profile 341. The building structure profile 341, of building structure volume 300, is obtained by sectioning the building structure volume 300 at roof truss 340. As shown in FIG. 3C, roof truss 340 is supported by wall 302, wall 304 and I-beam 314. The building structure profile also includes a component profile of airduct 308, airduct 310 and airduct 312. Airduct 312, as shown in FIG. 3C, is within the profile of roof 20 truss 340. As such, a designer inserting web members within the profile of roof truss 340 would place the web members so as not interfere with the component profile of airduct 312. Similarly, a designer inserting components, within the building structure volume 300, below roof truss 340, would place the components so as not interfere with the component profiles of I-beam 314, airduct 308, airduct 310 and walls 302 and 304.

Figure 3D:
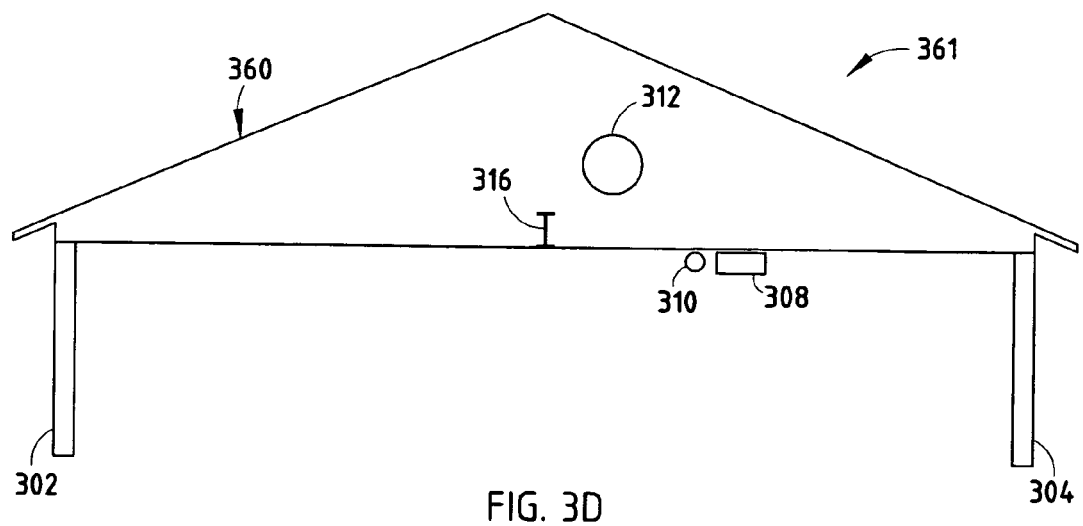

FIG. 3D shows a front view of the building structure volume 300. Wall 302 and wall 304 support roof truss 360 at opposite ends, along a bottom chord. A component profile of I-beam 316 and airduct 312 are shown within the interior of the profile of roof truss 360. As designed, the bottom chords of roof truss 360 will attach to I-beam 316. In positioning web members within the profile of roof truss 360, a designer would place the web members so as to not interfere with airduct 312 (as indicated by the component profile of airduct 312). Similarly, a designer inserting components, within the building structure volume 300, below roof truss 360 would place the components so as not interfere with the component profiles of airduct 308, airduct 310 and walls 302 and 304.

Figure 3E:
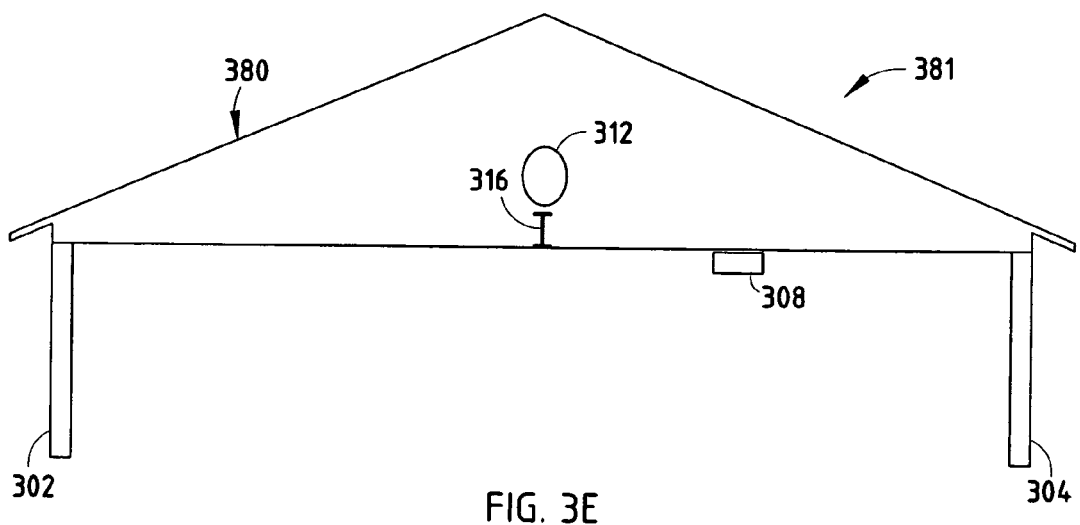

FIG. 3E depicts the three dimensional building structure volume sectioned at roof truss 380. Roof truss 380 is supported at opposite ends by wall 302 and wall 304. A component profile indicates that airduct 312 is routed through roof truss 380. As in FIG. 3D, the bottom chords of roof truss 380 attach to I-beam 316. A designer designing roof truss 380 would place the top and bottom chords and the web members such that interference with the airduct 312, as indicated by its component profile, is avoided. Similarly, a designer inserting components within the building structure volume 300, below roof truss 360, would place the components so as not interfere with the component profiles of airduct 308 and walls 302 and 304.

Figure 4A:
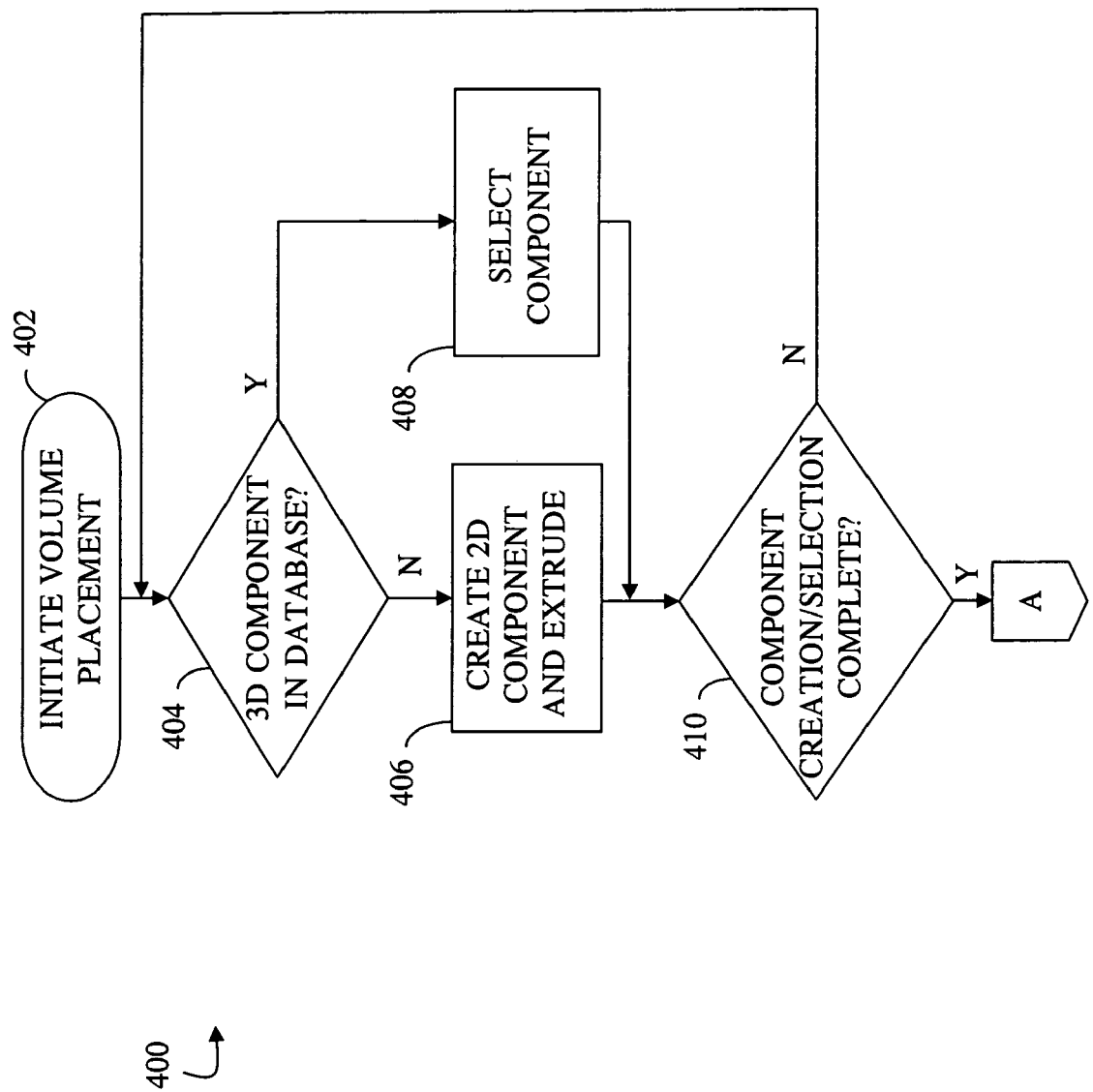
FIGS. 4A–4B are a flow chart of a volume placement routine for volume detailing a building structure, according to an embodiment of the present invention.
Figure 4B:
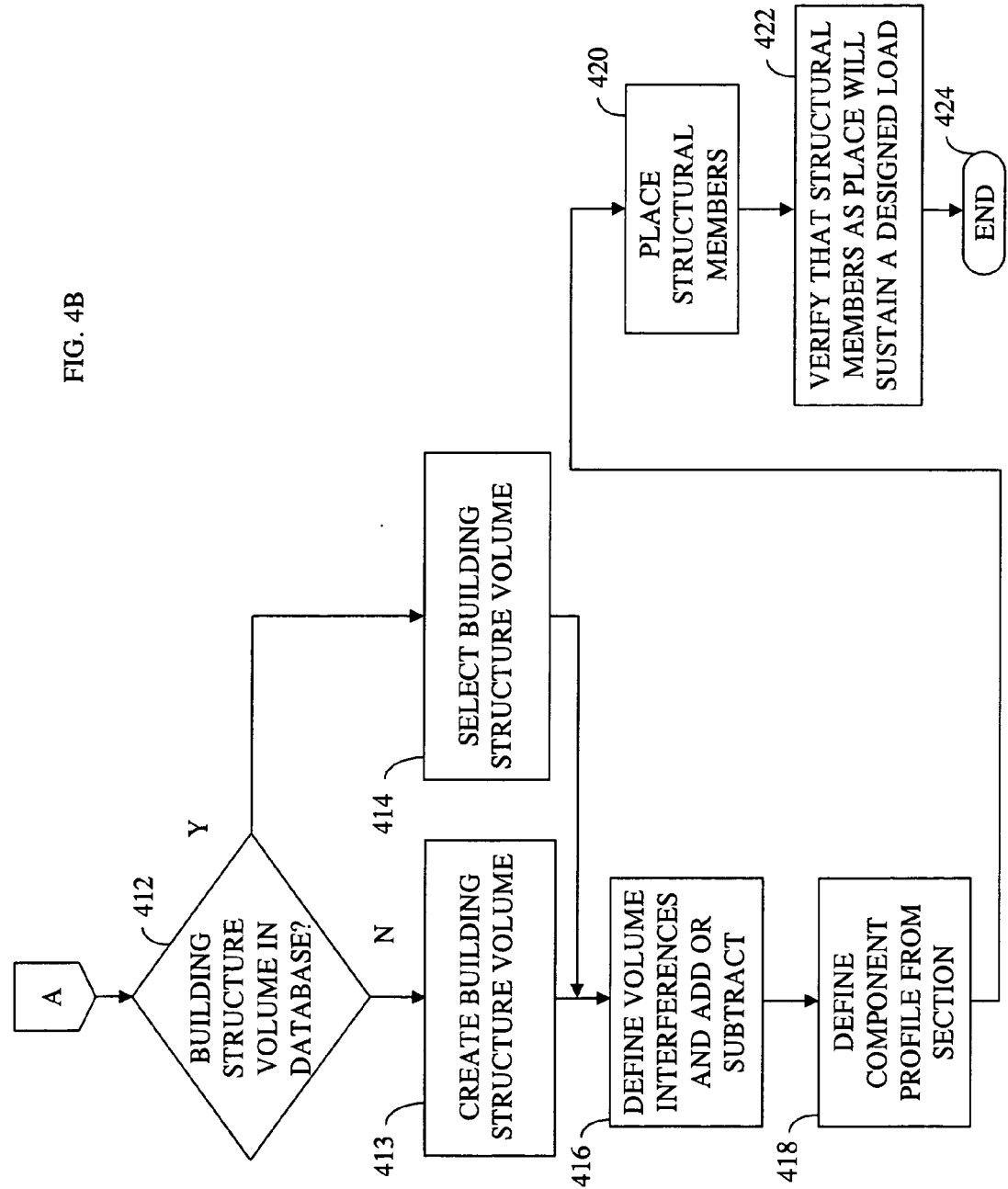

FIGS. 4A and 4B are a flow chart of a volume placement routine 400 for volume detailing a building structure, according to an embodiment of the present invention. In step 402, volume placement is initiated. Next, in step 404, routine 400 determines whether a desired component is in a system database. If so, control transfers from step 404 to step 408, in which the component is selected from the system database. Control then transfers to step 410. If the component is not in the system database in step 404, a user creates a two dimensional component and causes the CAD package to extrude that component to the appropriate dimension. The component can be a structural component (e.g., beams, columns, walls, etc.) or a non-structural component (e.g., ductwork, walkways, etc.). From step 406, control transfers to step 410.

In step 410, routine 400 determines whether a user has completed the component selection/creation process. If so, control transfers from step 410 to step 412. Otherwise, control transfers from step 410 to step 404. In step 412, a determination is made as to whether a desired building structure volume is within the system database. If so, control transfers from step 412 to step 414. In step 414, a building structure volume is selected at which point control transfers to step 416. If a desired building structure volume is not available within the system database in step 412, control transfers to step 413.

In step 413, a user creates a three dimensional building structure volume. From step 413, control transfers to step 416. In step 416, a volume interference is created by either adding or subtracting any three dimensional components to/from the building structure volume. Next, in step 418, a building structure profile is created by sectioning the building structure volume at a point of interest. That building structure profile includes a component profile, if a three dimensional component extends through the point of interest. Then in step 420, a plurality of additional component profiles are added within the building structure profile, at the point of interest, such that the additional component profiles did not interfere with one another or interfere with the component profile of the three dimensional component. Next, in step 422, a designer verifies that the placement of the structural members are such that the building structure will meet design criteria (e.g., meet a design load). From step 422, control transfers to step 424 where routine 400 ends.

Thus, a system has been described that volume details a building structure in a manner that allows a designer to consider the positioning of various structural and non-structural components when detailing a building structure. In many cases, this allows costly on-site modifications, to a structural component of a building structure, to be avoided. In the situation where the dimension of a component is modified after design (e.g., increased), a building structure profile can be utilized to advise an installer where the component can be readily routed.

The above description is considered that of the preferred embodiments only. Modification of the invention will occur to those skilled in the art and to those who make or use the invention. Therefore, it is understood that the embodiments shown in the drawings and described above are merely for illustrative purposes and not intended to limit the scope of the invention, which is defined by the following claims as interpreted according to the principles of patent law, including the Doctrine of Equivalents.

What is claimed is:

1. A roof truss volume detailing system for volume detailing a system of roof trusses that allows for the consideration of the positioning of various structural and non-structural components, comprising:
   a processor;
   a memory subsystem coupled to the processor, the memory subsystem storing information;
   an input device coupled to the processor, the input device receiving input from a user; and
   volume detailing code embodied in the memory subsystem for causing the processor to perform the steps of:
      providing a representation of a three dimensional roof truss volume, wherein the three dimensional roof truss volume models a system of roof trusses;
      positioning a representation of a three dimensional component at a desired location relative to the three dimensional roof truss volume;
      sectioning the three dimensional roof truss volume at a plurality of points of interest to provide two dimensional roof truss profiles that include a component profile if the three dimensional component extends through the points of interest; and
   designing roof trusses based upon the roof truss profiles.

2. The system of claim 1, further including the step of:
   placing a plurality of additional component profiles within the roof truss profiles at the points of interest such that the additional component profiles do not interfere with one another or interfere with the component profile of the three dimensional component.

3. The system of claim 1, wherein the roof truss volume and the three dimensional component are selected from a group of predetermined shapes.

4. The system of claim 1, wherein an outer surface of the roof truss volume is defined by at least an outer surface of a bottom chord and an outer surface of a plurality of top chords of a roof truss that is part of the system of roof trusses.

5. The system of claim 2, wherein the positioning a representation of a three dimensional component at a desired location relative to the three dimensional roof truss volume step further includes the step of:
   subtracting the three dimensional component from the three dimensional roof truss volume.

6. The system of claim 1, wherein the three dimensional component is an air duct associated with a heating, ventilating and air conditioning (HVAC) system.

7. The system of claim 1, wherein the three dimensional component is a cat walk.

8. The system of claim 2, wherein the placing a plurality of additional component profiles within the roof truss profiles at the points of interest such that the additional component profiles do not interfere with one another or interfere with the component profile of the three dimensional component step further includes the step of:
   verifying that the placement of structural members is such that the roof trusses meet design criteria.

* * * * *

UNITED STATES PATENT AND TRADEMARK OFFICE
CERTIFICATE OF CORRECTION

PATENT NO. : 6,931,364 B1  
DATED : August 16, 2005  
INVENTOR(S) : G. Douglas Antuma Page 1 of 1

It is certified that error appears in the above-identified patent and that said Letters Patent is hereby corrected as shown below:

Title page,
Item [75], Inventor, "Anturna" should be -- Antuma --;

Column 2,
Line 66, delete "20"; and

Column 5,
Line 37, delete "20".

Signed and Sealed this

Twenty-eighth Day of March, 2006

JON W. DUDAS  
*Director of the United States Patent and Trademark Office*